United States Patent [19]

Yue et al.

[11] Patent Number: 5,061,644
[45] Date of Patent: Oct. 29, 1991

[54] METHOD FOR FABRICATING SELF-ALIGNED SEMICONDUCTOR DEVICES

[75] Inventors: Jerry Yue, Roseville; Michael S. T. Liu, Bloomington, both of Minn.

[73] Assignee: Honeywell Inc., Minneapolis, Minn.

[21] Appl. No.: 587,175

[22] Filed: Sep. 20, 1990

Related U.S. Application Data

[63] Continuation of Ser. No. 288,475, Dec. 22, 1988, abandoned.

[51] Int. Cl.$^5$ .................... H01L 21/20; H01L 21/331
[52] U.S. Cl. ........................................ 437/31; 437/28; 437/89; 437/91; 437/162; 437/909; 437/112; 437/924; 148/DIG. 27; 148/DIG. 29; 148/DIG. 43; 148/DIG. 124
[58] Field of Search .................... 437/31, 32, 162, 89; 148/DIG. 26, DIG. 27, DIG. 124, DIG. 29, DIG. 43

[56] References Cited

U.S. PATENT DOCUMENTS

| | | | |
|---|---|---|---|
| 3,746,908 | 7/1973 | Engeler | 148/DIG. 26 |
| 4,190,949 | 3/1980 | Ikeda et al. | 29/571 |
| 4,269,631 | 5/1981 | Anantha et al. | 148/1.5 |
| 4,507,158 | 3/1985 | Kamins et al. | 437/89 |
| 4,508,579 | 4/1985 | Goth et al. | 148/175 |
| 4,522,662 | 6/1985 | Bradbury et al. | 148/DIG. 26 |
| 4,551,394 | 11/1985 | Betsch et al. | 428/641 |
| 4,566,914 | 1/1986 | Hall | 148/1.5 |
| 4,578,142 | 3/1986 | Corboy, Jr. et al. | 156/612 |
| 4,637,127 | 1/1987 | Kurogi et al. | 29/576 |
| 4,651,407 | 3/1987 | Bencuya | 29/571 |
| 4,716,128 | 12/1987 | Schubert et al. | 437/41 |
| 4,829,016 | 5/1989 | Neudeck | 437/31 |

FOREIGN PATENT DOCUMENTS

| | | | |
|---|---|---|---|
| 0168324 | 1/1986 | European Pat. Off. | |
| 0115181 | 10/1978 | Japan | 437/89 |
| 0056320 | 4/1983 | Japan | 437/89 |
| 0132919 | 8/1983 | Japan | 437/89 |

*Primary Examiner*—Brian E. Hearn
*Assistant Examiner*—Tuan Nguyen
*Attorney, Agent, or Firm*—Gregory A. Bruns; John J. Gresens

[57] ABSTRACT

A method of forming a self-aligned contact to a transistor component located on a semiconductor substrate comprising forming a transistor component opening in a masking layer overlying a semiconductor substrate and using epitaxial lateral overgrowth to form a self-aligned contact, the epitaxial overgrowth beginning in the masking layer opening at an upper surface of the semiconductor substrate and extending normal to and laterally over the masking layer surface.

10 Claims, 4 Drawing Sheets

METHOD FOR FABRICATING SELF-ALIGNED SEMICONDUCTOR DEVICES

This is a continuation of application Ser. No. 07/288,475, filed Dec. 22, 1988, which was abandoned upon the filing hereof.

BACKGROUND OF THE INVENTION

The present invention relates to self-aligned semiconductor devices and a method for their manufacture. The invention is particularly application to self-aligned bipolar transistors. The present process may also relate to the manufacture of other self-aligned transistor components.

The fabrication of semiconductor transistor devices can be complex, requiring multiple steps which inherently incorporate any number of process limitations. These process limitations may ultimately affect the functioning of the transistor device. For example, the use of nonself-aligned processes results in multiple overlapping photo-patterning steps. The inherent inaccuracy resulting from these multiple photo-patterning process steps most often cannot be compensated for and may result in overlap between emitter and inactive base regions, which, in turn, can lower breakdown voltage. Alternatively, compensating for an overlap problem by allowing extra area between the active and inactive regions may create problems such as an undesirably high base resistance within the transistor.

SUMMARY OF THE INVENTION

The method of the present invention comprises forming a self-aligned contact to a transistor component located in a semiconductor substrate comprising the steps of forming a transistor component opening in a masking layer overlying a semiconductor substrate and using epitaxial lateral overgrowth to form a self-aligned contact. The epitaxial overgrowth begins in the masking layer opening at the surface of the semiconductor substrate and extending normal to and laterally over the masking layer surface.

DETAILED DESCRIPTION OF THE PRESENT INVENTION

Figure 1:
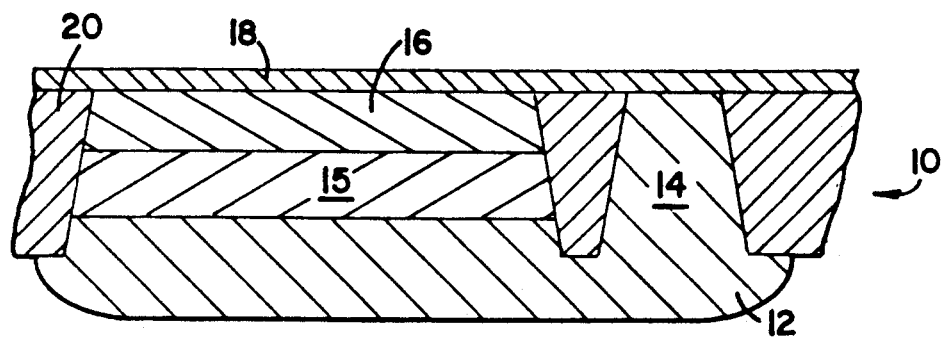
FIG. 1 depicts a partial cross-sectional view of a typical semiconductor substrate prepared for use in the fabrication of a bipolar transistor in accordance with the present invention.

The present invention will be illustrated through the fabrication of an exemplary NPN bipolar transistor. Those skilled in the art will realize that this invention is equally applicable to the fabrication of other transistor and semiconductor devices.

Referring to the drawings, a semiconductor substrate 10 comprises a heavily doped collector region 12 which adjoins a sinker 14 bordered on either side by dielectric isolation areas 20. The semiconductor substrate 10 is covered by a masking layer 18. Adjacent to the sinker 14 and separated by a dielectric isolation area 20 is an active base 16 which is adjoined to the collector region 12 by an epitaxial region 15. The masking layer 18 is patterned in the region measured by W to form an opening 22 over the active base 16 providing an area for the formation of an emitter 24 and a self-aligned emitter contact 26, FIGS. 3a-8.

Figure 3A:
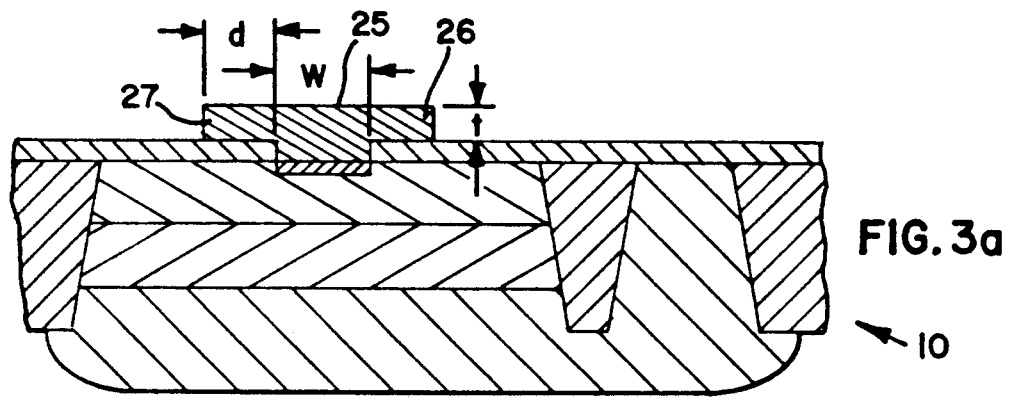
FIGS. 3a through 8 depict partial cross-sectional views of preferred bipolar transistor component structures.
Figure 3B:
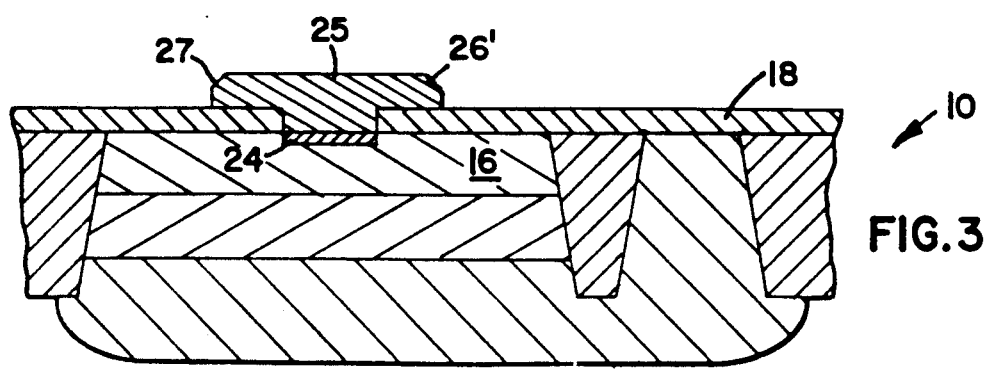
Figure 3C:
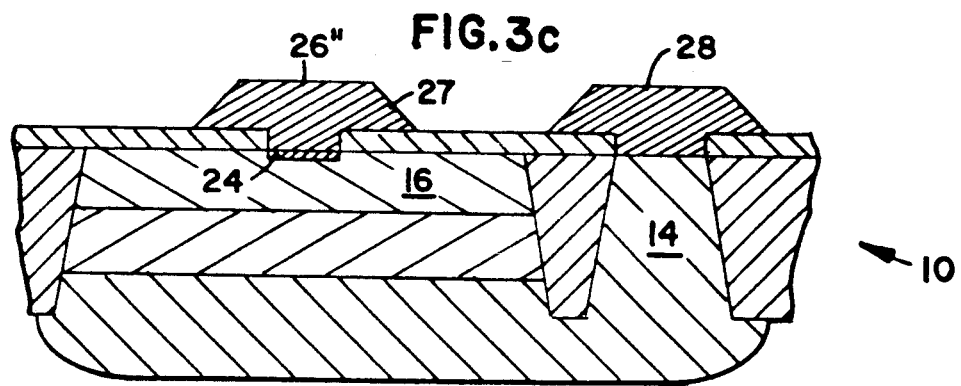

Optionally, the mask 18 may also be patterned to allow the formation of a self-aligned sinker contact 28, FIG. 3c. As will be further discussed below, substrate 10 may also be subjected to additional implantation to form an inactive base region 32 (FIGS. 6a, 6b, 7c) which is self-aligned around emitter 24 below an area surrounding the area covered by emitter contact 26.

In accordance with the present invention, a high performance self-aligned bipolar transistor is fabricated by first providing a semiconductor substrate such as 10. The semiconductor substrate 10 is processed through any general means well known to those having ordinary skill in the art to provide a collector region 12, a sinker 14, an active base region 16, and optionally, dielectric isolation areas 20. An exemplary preparation process follows below.

The preparation of the substrate 10 is typically initiated by the implantation of a heavily doped collector region 12 which may be completed through the ion implantation of an impurity concentration ranging from $1 \times 10^{19}$ to $1 \times 10^{21}$ cm$^{-3}$. Any ion source which will provide the necessary impurities to form the collector region can be used. Examples include arsenic, phosphorous and antimony. The collector region may be finalized through a high temperature anneal ranging from 1100° to 1250° C. for a period of about 1 to 5 hours.

Epitaxial layer 15 may be formed over the collector region 12 through doping with an arsenic source such as AsH$_3$ or any other N-type dopant impurities during growth. Generally the thickness of the epitaxial layer 15 ranges from about 0.5 micrometers to 2.0 micrometers resulting from a doping concentration of $5 \times 10^{15}$ to $7 \times 10^{16}$ cm$^{-3}$. Dielectric isolation areas 20 then may be formed in the semiconductor substrate 10. These isolated regions may be refilled using conventional processes which provide for the growth of silicon dioxide or any other equivalent dielectric.

A sinker 14 then may be driven into the semiconductor substrate through the use of an ion implant to provide a concentration ranging from $1 \times 10^{19}$ to $1 \times 10^{20}$ cm$^{-3}$ using 60 to 100 kev implantation. This sinker implant then typically is annealed at temperatures usually ranging from 900° to 1000° C..

Active base 16 then typically is formed into the surface of the semiconductor substrate 10 between the dielectric isolation areas 20. Generally ion sources such as elemental boron or BF$_2$ at concentrations ranging from $1 \times 10^{17}$ to $5 \times 10^{18}$ cm$^{-3}$ using 40 to 100 kev are suitable for providing the requisite impurity concentration to form an operable active base.

Once the semiconductor substrate 10 has been prepared for the fabrication of a device such as a bipolar transistor, processing in accordance with the present invention may begin. A masking layer 18 typically is formed on the upper surface of the active base 16, FIG. 1. There are then a number of alternative preferred process steps which may be undertaken toward the formation of a self-aligned contact to a transistor component.

Following below are alternative processes which may be used in forming an emitter 24 and an emitter contact 26. For instance, the masking layer 18 may be either a thermally grown oxide or a deposited dielectric material such as an oxide or a nitride with the oxide being preferred. Typically the thickness of this material will be between 30 and 100 nanometers.

In one preferred process, emitter 24 is implanted directly into the substrate 10, and a self-aligned emitter contact such as 26 is grown from the previously formed emitter. This process will be described initially.

Figure 2:
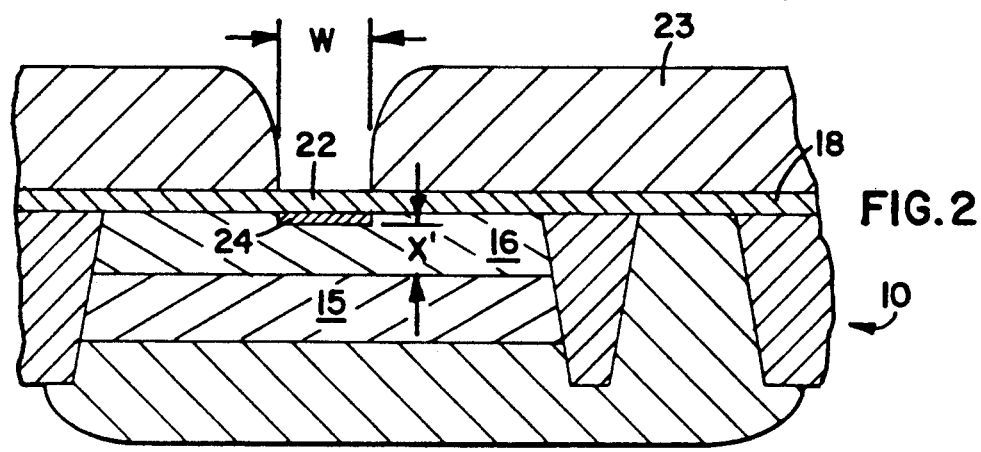
FIG. 2 depicts the semiconductor substrate shown in FIG. 1 further processed to expose an opening in the upper surface of the semiconductor substrate.

Generally, as seen in FIG. 2, a photoresist 23 is deposited on mask 18 and patterned to form region 22 measured by distance W, in which the emitter contact 26 will form. The emitter 24 may be formed prior to formation of the emitter contact or, as will be discussed later, the emitter may be formed subsequent to the formation of the emitter contact 26. If the emitter 24 is to be formed prior to the formation of the emitter contact 26, an impurity implantation then may be undertaken to form the emitter 24. The emitter 24 can be formed by implantation with an impurity source such as antimony, phosphorous, or arsenic ions to result in a concentration ranging from $1 \times 10^{20}$ to $1 \times 10^{21}$ cm$^{-3}$ after anneal in an ambient nitrogen atmosphere for 15 to 30 minutes at 900° to 1000° C. The emitter 24 typically is implanted in the active base 16 to a depth of preferably 1000 Å or less.

Preferably, the emitter implantation is shallow providing a distance X' as a base width between the bottom of the emitter 24 and the upper surface N-type epitaxial region 15, FIG. 3a. Generally X' ranges from approximately 0.1 micrometers to 0.2 micrometers between the base of the emitter 24 and the epitaxial region 15. A smaller base width X' provides a higher switching speed and, in turn, a faster transistor. In contrast, the base width should not be too small or depletion region overlap problems may arise between the emitter and collector regions once the device is activated.

In accordance with one implementation of the present invention, epitaxial lateral overgrowth then may be used to grow the emitter contact 26. The emitter contact 26 may be formed alternatively of either monocrystalline silicon or polycrystalline silicon. The epitaxial overgrowth begins in masking layer opening 22 at the exposed surface of the semiconductor substrate and extends first in a direction normal to, and then laterally over, the masking layer surface. Through the process of the present invention, emitter contact 26 is self-aligned to the emitter 24, FIG. 3a. As will be further explained below, the emitter contact may then be used in accordance with a preferred step of the present invention to form a self-aligned inactive base region 32 surrounding emitter 24 and emitter contact 26.

The shape and size of the emitter contact 26 will depend upon the crystal lattice orientation of the active base upper surface 16 and the growth conditions under which the contact 26 is formed. Preferably the exposed portion of the active base upper surface 16 will have a silicon crystal lattice orientation which is (100), and one edge of Z; emitter opening 22 will be aligned with the <100> axis. This lattice orientation has been found to be preferable in defining an emitter contact 26 of uniform structural dimension with an absence of crystal defects.

Preferably three gases are used in forming the emitter contact 26, namely, a silicon source such as silicon tetrachloride, trichlorosilane, dichlorosilane, or silane, as well as a chlorine source such as HCl, or chlorine gas and an inert carrier gas such as H$_2$. The active source of silicon typically is injected into the growth chamber at a concentration of 0.15 to 0.4 liters per minute. The chlorine source gas is present generally in a concentration of 0.4 to 1.0 liters per minute. Finally, the carrier gas is generally present in a concentration ranging from 70 to 150 liters per minute and acts as a carrier for the other two gaseous constituents.

FIGS. 3a through 3c exhibit various exemplary alternative geometric shapes which the emitter contact may take, the emitter contact being designated by 26, 26', 26'' in each of FIGS. 3a, 3b, and 3c, respectively. These exemplary embodiments of the emitter contact will be used interchangeably to illustrate alternate preferred embodiments of the present invention throughout this disclosure. As shown first in FIG. 3a, appropriately controlled growth conditions as described below may be used to provide an emitter contact 26 having near perpendicular sidewalls 27 oriented substantially at 90° to the upper surface of the semiconductor substrate 10. Perpendicular sidewalls 27 are preferred as they provide an emitter contact having a maximum uniformity in height (t) across the entire width of the contact 26. In turn, this emitter contact geometry provides an optimal implant mask during the optional subsequent formation of inactive base region 32.

Variance in the angle or orientation of the sidewall 27 in relation to the upper surface of the semiconductor substrate 10 or the active base 16 also typically depends upon the relative concentration of the gaseous constituents present during the growth process. For instance, as seen in FIG. 3a, given a constant concentration of carrier gas, the use of a greater relative concentration of a chlorine source gas such as HCl in relation to the silicon source gas and combined with a higher temperature produces an emitter contact 26 having substantially perpendicular sidewalls 27 in relationship to the upper surface of the active base 16 and the upper surface 25 of the emitter contact 26.

Alternatively, as seen in FIG. 3b, the use of a higher relative concentration of a silicon source gas such as dichlorosilane in relation to the concentration of a chlorine source gas such as HCl and combined with a lower temperature results in an emitter contact 26' having sidewalls which are increasingly oriented at a substantially 45° angle in relationship to the upper surface of the active base 16. Increasing the relative concentration of HCl gas in the growth chamber gradually reduces the portion of the emitter contact sidewalls 27 oriented at less than a perpendicular angle in relationship to the upper surface 25 of the emitter contact.

Moreover, as can be seen in FIG. 3c, reducing the chlorine source gas concentration to 0 liters/minute in relation to the silicon source results in an emitter contact such as 26'' having sidewalls 27 which are oriented at 45° from the upper surface of the active base 16 as seen in FIG. 3c. Thus, as can be seen, it is possible to provide an emitter contact 26 having a variety of shapes.

Generally, the other parameters which affect the formation of the emitter contact are the time and temperature of growth. The temperature in which the emitter contact can be grown ranges from about 850° C. to 1100° C. Preferably, a low temperature of 900° C. is used as a formation temperature for the emitter contact 26. A relatively low temperature of the emitter contact 26 formation insures that previously completed impurity implantations will not subsequently diffuse during this formation process and contaminate unintended areas of the semiconductor substrate 10. The time of emitter contact 26 formation will generally range from 5 to 20 minutes with a typical growth formation period of approximately 20 minutes allowing for the greatest control over the shape of the emitter contact 26. Additionally, an extended growth or formation period reduces the occurrence of crystal irregularities or faults.

Generally, emitter region 22 has a window length W of approximately 0.5 to 2.0 micrometers. In turn, the lateral overgrowth area, d, typically ranges in size from 0.1 to 0.5 micrometers. Finally, the height of the emitter contact, t, normally ranges from less than 0.35 to 0.5 micrometers. Those skilled in the art will appreciate that other dimensions are possible.

A sinker contact such as 28 of the same relative proportion as the emitter contact 26'', as seen for example in FIG. 3c, may be grown during the same growth process. Under such circumstances the sinker contact 28 typically is grown under substantially the same circumstances, without alteration in time, temperature, or in the quantity of constituents necessary to provide the growth of a corresponding contact such as 26''. Once the emitter contact and sinker contact are grown, they are doped by conventional means to make them electrically conductive with their respective contact surface.

As was noted earlier, the present invention has an alternative aspect, whereby the emitter may be formed after the growth of the emitter contact. Formation of the emitter 24 in accordance with the latter approach (which can include either of two alternative processes described below) may be desirable to form a much shallower emitter 24 in the active base 16 and, in turn, provide a higher speed device.

Figure 4A:
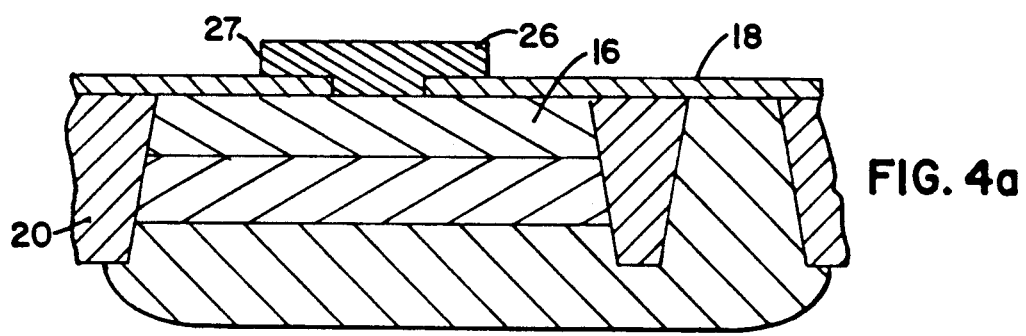
Figure 4B:
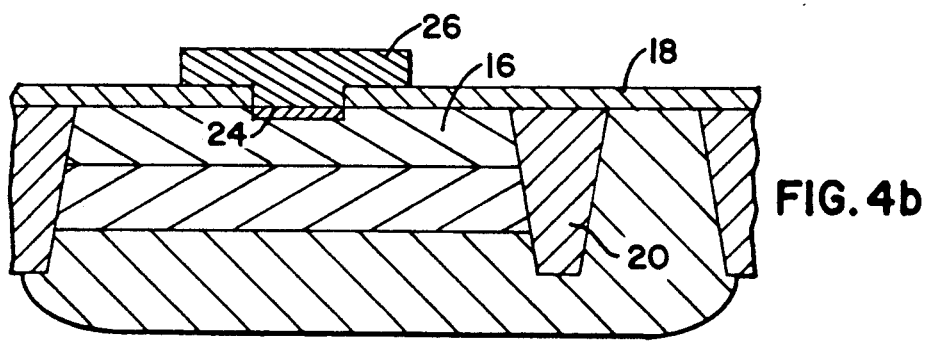

First, as depicted in FIGS. 4a and 4b, an emitter contact such as 26 is grown under the conditions of the present invention as previously disclosed. Although emitter contact embodiment 26 is shown, other embodiments such as 26' or 26'' could also be used. During the growth process, the emitter contact 26 is subjected to in situ doping which provides an ion impurity concentration of about $1 \times 10^{20}$ to $1 \times 10^{21}$ cm$^{-3}$ using 40 to 60 kev. An example of a finished emitter contact 26 carrying the impurity is shown in FIG. 4a. The emitter contact 26 is then subjected to an annealing process which typically ranges in temperature from 900° C. to 1000° C. for 10 to 60 minutes. Such an anneal provides a uniform diffusion of impurity throughout the emitter contact 26 and forms the emitter 24. The formation of the emitter 24 by diffusion of ion impurities from the emitter contact 26 after the growth of the emitter contact 26 typically produces an emitter 24 having a depth of 500 to 1000 angstroms.

Figure 5A:
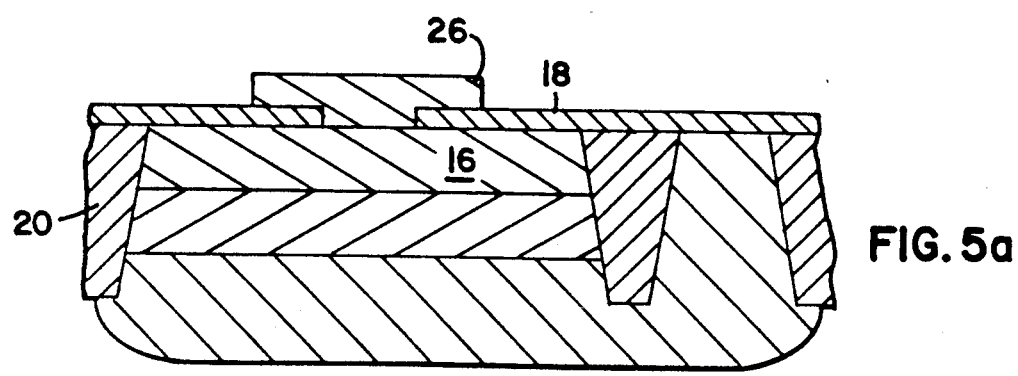
Figure 5B:
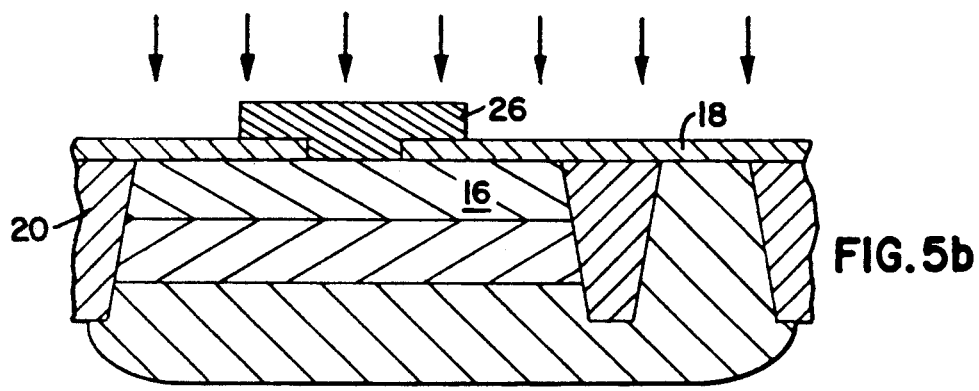
Figure 5C:
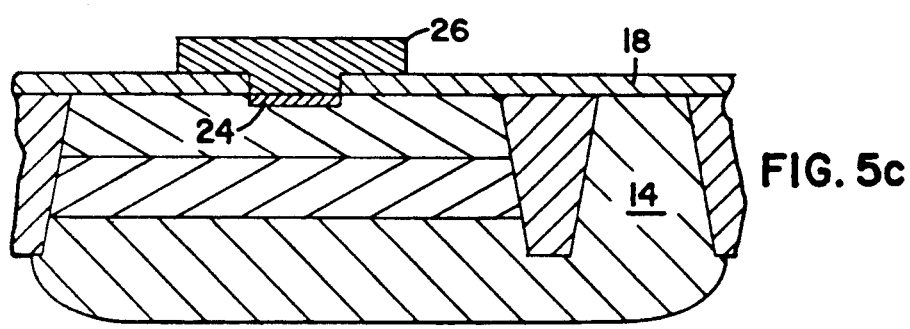

Alternatively, the emitter may be formed subsequent to the formation of an emitter contact 26 as shown in FIGS. 5a through 5c (here again, although emitter contact 26 is shown, other emitter contact embodiments such as 26' and 26'' may be used). First, an emitter contact is grown at the exposed surface of the active base 16 to laterally over grow the mask layer 18, FIG. 5a. The emitter contact is then subjected to an implant process, FIG. 5b, to define a concentration of ion impurity. The resulting ion concentration preferably ranges from $1 \times 10^{20}$ to $1 \times 10^{21}$ cm$^{-3}$ using 40 to 60 kev. Subsequent to this implant, the emitter contact 26 is subjected to an anneal which results in the uniform diffusion of ion impurity throughout the emitter contact 26, as well as the formation of emitter 24, FIG. 5c. Here again, the formation of emitter 24 by diffusion from the emitter contact 26 after implanting the emitter 26 typically produces an emitter 24 having a depth of 500 to 1000 angstroms.

The formation of an emitter 24 by implant of the emitter contact after formation and anneal is generally possible when a polycrystalline silicon emitter contact has been grown on the semiconductor substrate 10. Polycrystalline silicon has multiple grain boundaries which, unlike monocrystalline silicon, allow the rapid diffusion of ion impurities 29 through the emitter contact and into the active base 16, FIG. 5c. The uniform concentration of impurity throughout the emitter contact provides a low resistance throughout this structure. Also, as has previously been explained, the diffusion of ion impurity through the emitter contact results in a shallower emitter region 24 at the upper surface of the active base 16 and, in turn, a higher frequency and a higher performance device.

Figure 6A:
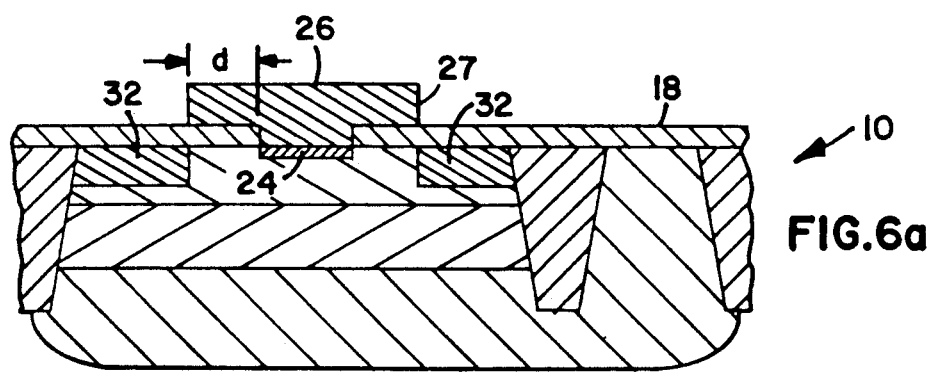

Once the emitter contact has been grown and the emitter formed, the inactive base region 32 may be formed in the semiconductor substrate. Here again, there are several alternative means of forming the inactive base 32 in accordance with the present invention as shown in FIGS. 6a, 6b, and 7a through 7c. In one approach, as shown in FIG. 6a, an emitter contact 26 is grown on the semiconductor substrate 10, with emitter 24 having been formed either before or after formation of emitter contact 26, as has previously been explained. A blanket implant of ion impurity may then be undertaken to form a self-aligned inactive base region 32. The configuration of emitter contact 26 can have particular advantages in the formation of base region 32. An emitter contact 26 having sides 27 which are oriented substantially perpendicular to the semiconductor substrate 10 has a uniform cross-sectional height which results in an optimal implant mask for the formation of inactive base region 32. The blanket implant generally results in a boron ion concentration in the inactive base region 32 of about $1 \times 10^{20}$ cm$^{-3}$.

Figure 6B:
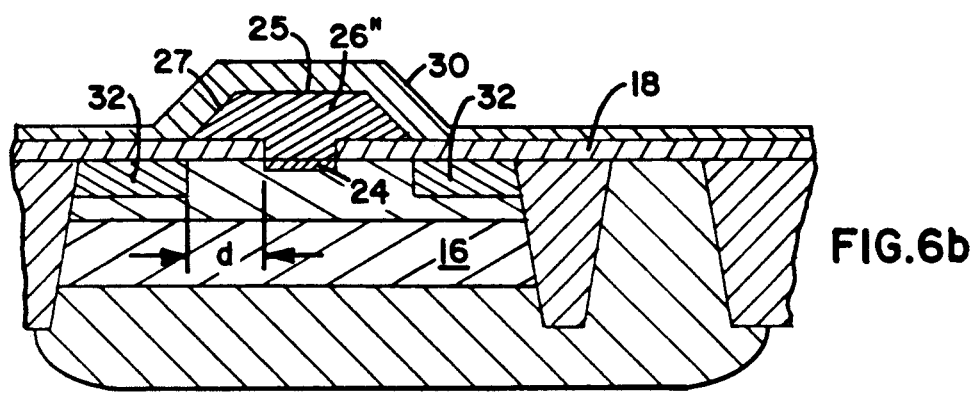

When the emitter contact is for example an alternative embodiment, as shown in FIG. 6b by emitter contact 26'', additional steps may be undertaken to ensure the proper formation of the inactive base region 32. Prior to the implantation of the inactive base region 32, it may be desirable to form an optional mask 30 onto the emitter contact 26''. The purpose of the emitter contact 26'' is to serve as a contact while also to provide adequate separation area, d, between the subsequently formed inactive base area 32 and an emitter 24, FIG. 6b. Such as mask 30 may be required when the emitter contact such as 26'', as shown in FIG. 6b, does not have a uniform crosssectional thickness. The use of an additional mask 30 provides protection against implanting the isolation area measured by d between the emitter 24 and the inactive base region 32. For example, as shown in FIG. 6b, if the emitter contact 26'' has sidewalls 27 oriented substantially at a 45° angle, the sidewalls 27 may not provide the mask necessary to form a uniformly effective plug mask, i.e., to uniformly isolate the emitter region 24 from the subsequently formed inactive base region 32.

Accordingly, an added dielectric mask 30 may optionally be formed on the emitter contacts such as 26' or 26'' either by thermal growth or deposition processes. Preferably, the dielectric mask 30 will be formed through thermal growth process to take advantage of a differential dielectric thickness which can be obtained if the emitter contact has been previously doped. Specifically, as can be seen in FIG. 6b, the dielectric layer 30 is thermally grown over masking layer 18 and emitter contact 26''. In the example the concentration of ion impurity in the mask layer 18 is negligible in comparison to the ion impurity concentration in the emitter contact 26'', which is relatively high. This differential impurity concentration results in a difference in oxide thickness over the planar surface of mask layer 18 and the nonplanar heavily doped surface of emitter contact 26''.

In fact, the previously doped emitter contact such as 26' or 26'' provides a substrate which promotes a much greater growth rate for the dielectric oxide which is thermally grown thereon. Generally, the oxide thickness over the ion doped emitter contact will be 2 to 3 times that of the oxide thickness formed on the mask layer 18. As a result, the oxide thickness is greatest over the emitter contact which is where the implant mask is most needed to prevent an implantation of the isolation area measured by d, as shown in FIG. 6b.

Once the oxide mask 30 is formed over the emitter and the emitter contact such as 26' or 26'', an ion implant is undertaken in accordance with the process of the present invention to form inactive base regions 32. The resulting inactive base region 32, as shown in FIG. 6b, is aligned to the emitter 24 and the emitter contact 26''.

Thus, as can be seen through the various permutations of the present invention, an alignment of the emitter contact, emitter, and inactive base regions can be provided regardless of the geometrical structure of the emitter contact formed through the processes of the invention.

Accordingly, this alternative implementation of the present invention controls the composition of the emitter contact to comprise a truncated portion such as 26'' with a substantially flat upper surface 25, and sidewalls 27 oriented at approximately 45° to the semiconductor substrate 10 upper surface. Optionally, a dielectric mask layer 30 may be formed over the 45° sidewalls in order to provide sufficient masking at the outer periphery of the emitter contact to form an effective plug mask over the entire area of the emitter contact.

Figure 7A:
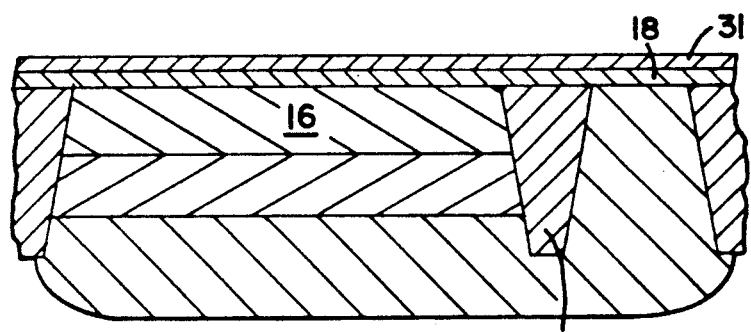
Figure 7B:
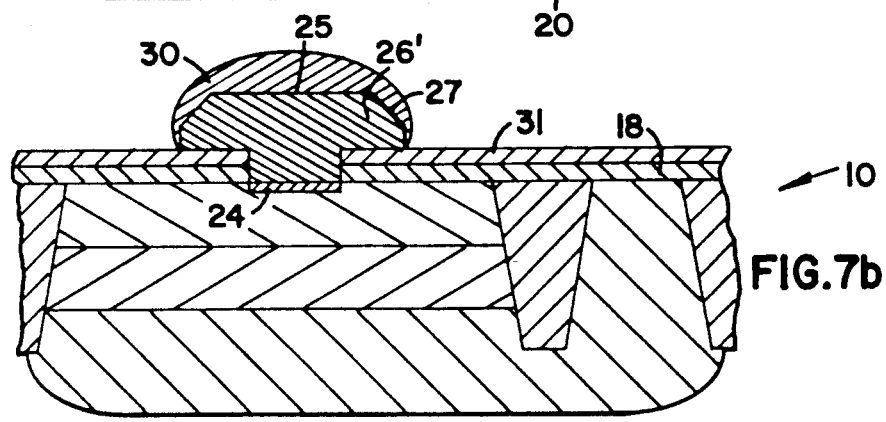
Figure 7C:
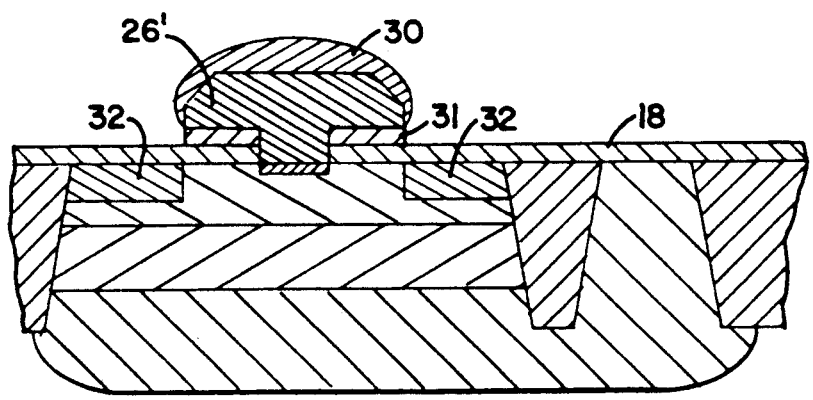
Figure 8:
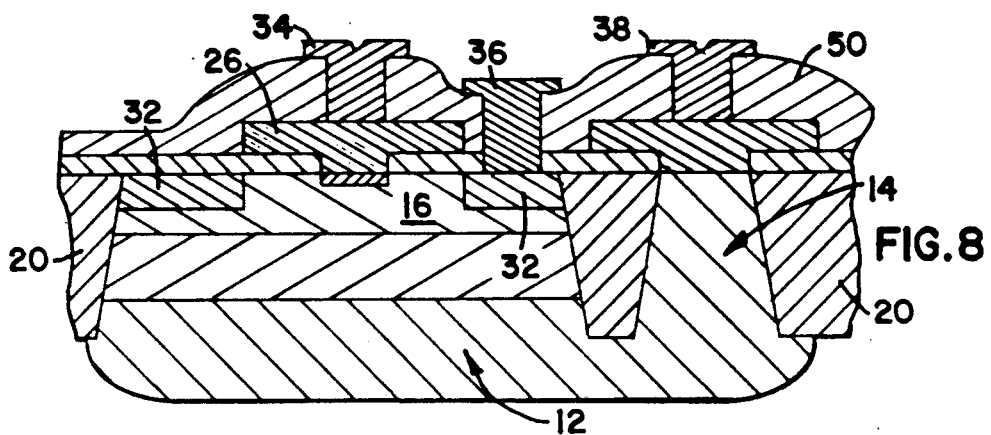

A further alternative of embodiment for forming an oxide mask layer 30 over the emitter contact is shown in FIGS. 7a through 7c. Those skilled in the art will realize that this alternative embodiment of the process of the present invention is not limited to the emitter contact geometry designated by 26'.

Turning to this alternative embodiment of the present invention, as can be seen in FIG. 7a, the semiconductor substrate is prepared for processing in accordance with the present invention as has been previously disclosed. Additionally, a dielectric layer 31 is deposited across the surface of mask layer 18. Dielectric layer 31 will function to restrict the formation of oxide mask 30 only to the emitter contact and not to the remaining planar surfaces of the semiconductor substrate 10 covered by mask layer 18.

Accordingly, the dielectric layer 31 may be any material which will prevent the formation of oxide mask layer 30 across the surface of the semiconductor substrate 10. Preferably, dielectric layer 31 will comprise silicon nitride, as the ambient oxygen used in the thermal growth processes to produce masking layer 30 is unable to diffuse through silicon nitride.

Once dielectric layer 31 is formed across the surface of mask layer 18, the device is further processed in accordance with the present invention to define an emitter contact such as 26' and an emitter 24 as shown in FIG. 7b. As additionally shown in FIG. 7b, a thermal growth process is undertaken to form the implant mask over the sidewalls 27 and upper surface 25 of the emitter contact 26'. Due to the presence of the dielectric layer 31, the oxide will not form across the planar surface of the semiconductor substrate 10. Once the masking layer 30 is formed on the emitter contact 26', the masking layer 31 is removed by reactive ion etching, as shown in FIG. 7c. The inactive base region 32 is then self-aligned and formed in accordance with the present invention.

This alternative embodiment of the present invention requires two extra steps in the deposition and patterning of the dielectric layer 31. However, this embodiment of the present invention provides a number of definite advantages. The dielectric layer 31 preferably composed of silicon nitride prevents a formation of thermally grown oxide across the surface of the semiconductor substrate. As a result, any process limitations founded in relying on differential oxide thickness to provide the requisite implant mask across the upper surface of the emitter contact are obviated.

Once the self-aligned transistor component such as inactive base region 32 is formed, a blanket layer of insulative material such as a boron-phosphorous doped silicate glass may be deposited over the surface of the semiconductor substrate 10. This insulative material 50 typically is patterned to provide for the formation of metal contacts over sinker 14, inactive base region 32, and emitter contact 26. A layer of metallization is then normally deposited over the insulative material 50 and patterned to form a sinker metal contact 38, an inactive base region metal contact 36 and the emitter metal contact 34, FIG. 8.

An example of the present invention has been illustrated using a high performance bipolar transistor, however, those of reasonable skill in the art will realize that it is possible to fabricate other types of transistors as well as other types of semiconductor devices using the process of the present invention.

We claim:

1. A method for fabricating a high performance bipolar transistor, comprising:
    (a) forming a silicon semiconductor substrate comprising an active base region, a collector, and a sinker, the sinker being adjacent to and electrically isolated from the active base region, the sinker further being electrically coupled to the collector;
    (b) forming a silicon oxide mask layer overlying the silicon semiconductor substrate;
    (c) forming a silicon nitride mask layer overlying the silicon oxide mask layer which overlies the semiconductor substrate;
    (d) defining an emitter opening through the mask layer so that an emitter area is exposed on the surface of the active base region;
    (e) using silicon and chlorine source gases to form an epitaxial lateral overgrowth defining a self-aligned emitter contact which comprises sidewalls and which grows in the emitter opening at the active base region surface and continues its growth throughout the emitter opening as well as normal to and laterally over the mask layer;
    (f) determining the contact shape and size by defining the angle of the self-aligned contact sidewalls through alteration of the concentration ratio of the silicon source gas and the chlorine source gas;
    (g) forming a dielectric mask layer over the contact sidewalls in order to provide sufficient thickness at the outer periphery of the emitter contact to act as an effective plug mask over substantially the entire are of the emitter contact wherein the silicon nitride mask layer precludes growth of the contact side wall mask layer across the substrate surface;

(h) removing the second silicon nitride mask layer from the surface of the silicon oxide mask layer; and (i) using the self-aligned emitter contact as a plug mask while implanting a self-aligned inactive base region into the substrate adjacent the area covered by the emitter contact.

2. The method of claim 1 further comprising:
(a) forming the mask layer so that it overlies the sinker as well as the active base region;
(b) defining a sinker opening through the mask layer so that at least a portion of the sinker is exposed; and
(c) using epitaxial lateral overgrowth to form a self-aligned sinker contact which begins its growth in the sinker opening at the sinker surface and continues its growth normal to and laterally over the mask layer.

3. The method of claim 1 wherein:
(a) the active base region upper surface comprises a (100) silicon crystal surface;
(b) the emitter opening is defined to comprise an edge which is aligned with a <100> silicon crystal direction; and
(c) the emitter contact is grown as a single silicon crystal.

4. The method of claim 1 wherein:
(a) the active base region upper surface comprises a (100) silicon crystal surface;
(b) the emitter opening is defined to comprise an edge which is aligned with a <100> silicon crystal direction; and
(c) the emitter contact is grown as polycrystalline silicon.

5. The method of claim 1 further comprising the step of using the self-aligned emitter contact as a plug mask while implanting a self-aligned inactive base region into the area surrounding the area covered by the emitter contact.

6. The method of claim 1 wherein the emitter contact is formed so that the sidewalls of the emitter contact comprise substantially flat surfaces oriented substantially perpendicular to the active base region, thus providing an emitter contact having a substantially uniform cross-sectional thickness.

7. The method of claim 1 wherein:
the emitter contact is formed so that the emitter contact comprises a truncated portion having substantially flat surfaces oriented at approximately 45 degrees to the active base region upper surface.

8. The method of claim 1 wherein:
(a) an emitter is implanted into the active base region through the emitter opening prior to forming the emitter contact; and
(b) the epitaxial lateral overgrowth begins at the emitter area.

9. The method of claim 1 further comprising:
(a) doping the emitter contact using an implantation process;
(b) annealing for a time sufficient to diffuse as emitter into the active base region.

10. The method of claim 1 further comprising:
(a) doping the emitter contact in situ during the epitaxial lateral overgrowth step; and
(b) annealing for a time sufficient to form an emitter in the active base region.

* * * * *